United States Patent
Suzuki et al.

(10) Patent No.: US 6,836,876 B2
(45) Date of Patent: Dec. 28, 2004

(54) SEMICONDUCTOR INTEGRATED CIRCUIT WIRING CONDITION PROCESSING PROGRAM

(75) Inventors: Katsuyoshi Suzuki, Hadano (JP); Masato Mogaki, Hadano (JP); Katsuaki Hongyo, Hadano (JP)

(73) Assignee: Hitachi, Ltd., Tokyo (JP)

(*) Notice: Subject to any disclaimer, the term of this patent is extended or adjusted under 35 U.S.C. 154(b) by 414 days.

(21) Appl. No.: 10/133,574

(22) Filed: Apr. 29, 2002

(65) Prior Publication Data

US 2002/0120913 A1 Aug. 29, 2002

Related U.S. Application Data

(63) Continuation of application No. 09/405,082, filed on Sep. 27, 1999, now Pat. No. 6,401,233.

(30) Foreign Application Priority Data

Sep. 25, 1998 (JP) .............................................. 10-271370

(51) Int. Cl.[7] .............................................. G06F 17/50
(52) U.S. Cl. ............................... 716/13; 703/19; 716/2; 716/6; 716/9; 716/10; 716/12; 716/14
(58) Field of Search ................................ 703/19; 716/2, 716/6, 9, 10, 12, 13, 14

(56) References Cited

U.S. PATENT DOCUMENTS

| 5,896,300 A | 4/1999 | Raghavan | 716/10 |
| 6,604,066 B1 * | 8/2003 | Hatsuda | 703/19 |

FOREIGN PATENT DOCUMENTS

| JP | 6-259492 | 9/1994 |

* cited by examiner

*Primary Examiner*—Thuan Do
(74) *Attorney, Agent, or Firm*—Antonelli, Terry, Stout & Kraus, LLP

(57) ABSTRACT

A computer program stored on a storage medium for performing wiring condition processing for a semiconductor integrated circuit. The computer program when executed causes a computer to perform the steps of creating layout information to determine a layout of devices on the semiconductor integrated circuit based on logic information describing connections of the devices on the semiconductor integrated circuit, determining a virtual wiring path from the layout information and calculating a wiring delay value based on the virtual wiring path. Other steps performed upon execution of the computer program include upon the calculated wiring delay value of the virtual wiring path exceeding a predetermined reference value, calculating a wiring delay value of the virtual wiring path when a wide wiring line is used at a predetermined usage ratio.

4 Claims, 10 Drawing Sheets

SEMICONDUCTOR INTEGRATED CIRCUIT WIRING CONDITION PROCESSING PROGRAM

CROSS REFERENCE TO RELATED APPLICATION

This is a continuation of U.S. application Ser. No. 09/405,082, filed Sep. 27, 1999 now U.S. Pat. No. 6,401,233, the subject matter of which is incorporated by reference herein.

BACKGROUND OF THE INVENTION

The present invention relates to a semiconductor integrated circuit wiring condition processing method for finding a wiring condition that is used when wiring a semiconductor integrated circuit.

Conventionally, when wiring a semiconductor integrated circuit, it is necessary to keep the wiring delay time (hereinafter called "delay") equal to or less than a predetermined delay reference value. To strictly meet the delay reference value requirements, a method such as the one disclosed in JP-A-6-259492 is known. In this method, the emitter follower current or the current switch current for the devices on each wiring path is controlled after wiring to keep the path delay variation to a minimum and to speed up the semiconductor integrated circuit. In addition, the use of a wide wiring line with a small wiring load capacity is generally known as a method for reducing the wiring delay.

SUMMARY OF THE INVENTION

It is an object of the present invention to provide a wiring condition processing method which reduces the power consumption of a circuit.

It is another object of the present invention to provide a wiring condition processing method which increases wiring channels.

It is still another object of the present invention to provide a wiring condition processing method capable of reducing variations in wiring delay times.

In the method, such as the one disclosed in JP-A6-259492 in which the emitter-follower current or the current switch current of a device is increased, there is a problem in that the circuit power consumption is increased to reduce the delay.

Conventionally, wide wiring lines have been used, for example, in all clock wires requiring strict delay restriction requirements. However, as more wide wiring lines are used, the number of wiring channels decreases. The decrease in the number of wiring channels results in some adverse effects such as wiring failures, more parallel non-wide wiring lines, and an increase in the chip size.

(1) To achieve the above objects, when the delay value of a virtual wiring line length based on the layout information on the devices on semiconductor substrate exceeds the reference value, the present invention adds information on the wide wiring line usage ratio to the path information to create wiring condition information.

This method, which uses wide wiring lines, reduces the power consumption. At the same time, this method sets up the usage condition for wide wiring lines and uses wide wiring lines only when this condition is satisfied, thus preventing the indiscriminate use of wide wiring lines and increasing the number of wiring channels.

(2) To achieve the above objects, when the delay value of the virtual wiring length based on the layout information on the devices on the semiconductor substrate exceeds the reference value, the present invention adds information on the usage ratio of a wiring layer with a small wiring load capacity to the path information to create wiring condition information.

This method, which uses a wiring layer with a small wiring load capacity, reduces the power consumption. At the same time, this method sets up the usage condition, thus reducing the use of wide wiring lines and increasing the number of wiring channels.

(3) To achieve the above objects, when the delay value of the virtual wirinq length based on the layout information on the devices on the semiconductor substrate exceeds the reference value, the present invention adds information on the usage ratio of parallel wiring lines to the path information to create wiring condition information.

This method, which restricts the use of parallel wiring lines, reduces the variation in delays and, at the same time, increases the number of wiring channels.

As described above, the method according to the present invention reduces the circuit consumption power and increases the number of wiring channels.

DESCRIPTION OF THE EMBODIMENTS

The configuration and the function of a wiring system using a wiring condition processing method according to one embodiment of the present invention will be described with reference to FIGS. 1–17.

Figure 1:
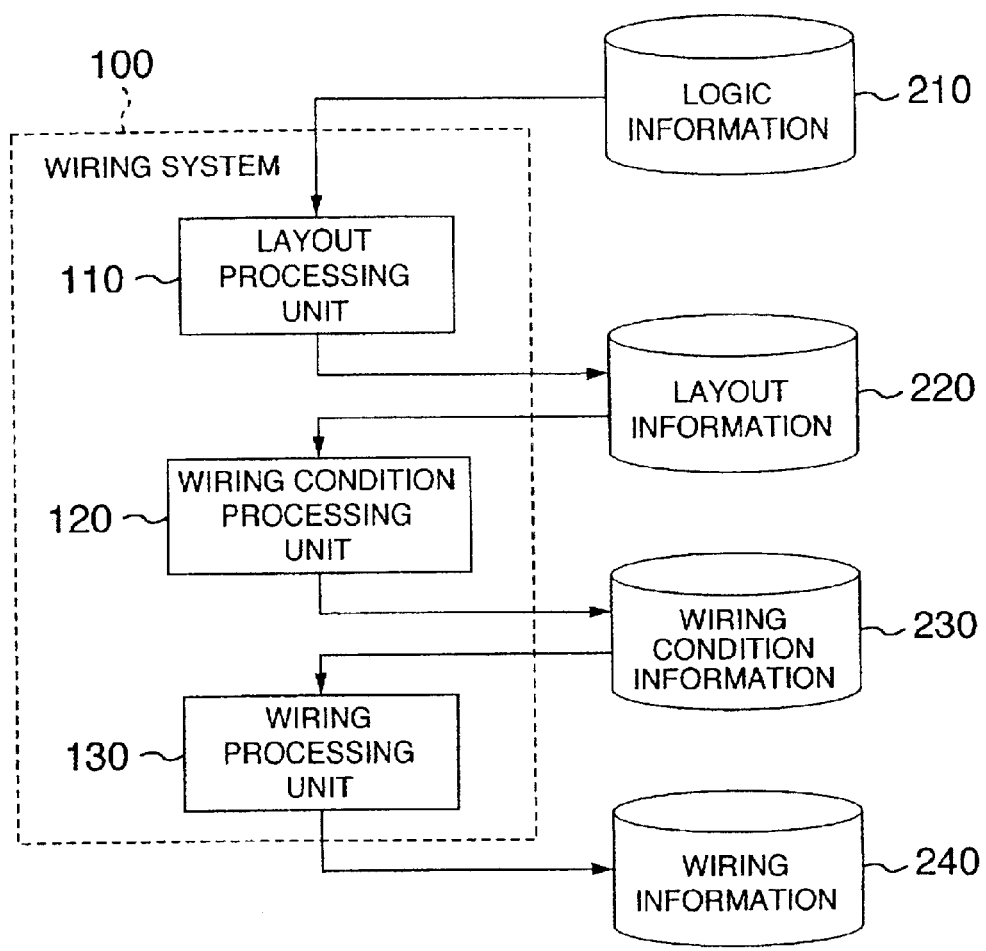
FIG. 1 is a block diagram showing the overall configuration of a wiring system using a wiring condition processing method according to one embodiment of the present invention.

First, the overall configuration of the wiring system using the wiring condition processing method according to this embodiment will be described with reference to FIG. 1.

A wiring system 100 comprises a layout processing unit 110, a wiring condition processing unit 120, and a wiring processing unit 130. The layout processing unit 110 finds the layout of the devices on the circuit substrate based on logic information 210 which is information describing the connections between the devices on the semiconductor integrated circuit, and outputs layout information 220. Examples of the logic information 210 and the layout information 220 will be described later with reference to FIGS. 9 and 11.

The wiring condition processing unit 120, the key component of this embodiment, finds a virtual wiring path from the layout information 220 before wiring processing that will be described later, finds a wiring delay based on this virtual wiring path, finds a wiring condition for keeping the delay equal to or smaller than the delay reference value, and outputs wiring condition information 230. An example of the wiring condition information 230 will be described later with reference to FIG. 13.

The wiring processing unit 130 finds an actual wiring path based on the wiring condition information 230 and outputs wiring information 240.

Figure 2:
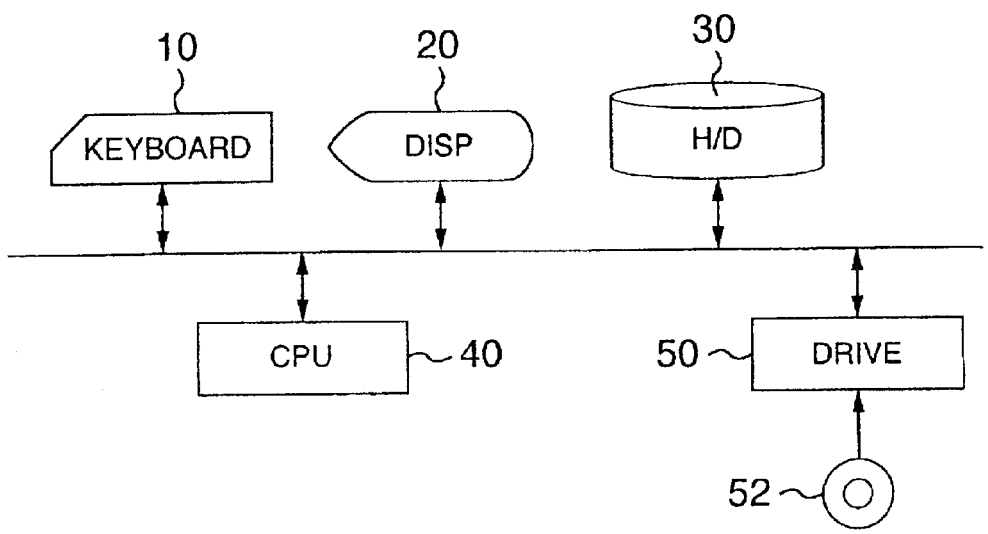
FIG. 2 is a block diagram showing the configuration of the hardware used to run the wiring system using the wiring condition processing method according to one embodiment of the present invention.

Next, the configuration of hardware used for running the wiring system according to this embodiment will be described with reference to FIG. 2.

A keyboard 10 is used to set up and enter condition information and so forth. On a display 20, execution results such as wiring condition processing results are displayed. A hard disk 30 stores therein the program used to run the wiring system according to this embodiment, the logic information 210 used as input information, the layout information 220 and wiring condition information 230 used as input and output information, and the wiring information 240 used as output information. A CPU 40 runs the program that executes the wiring system according to this embodiment. A media drive 50 reads the program used to run the wiring system according to this embodiment from a recording medium 52 such as CD-ROM and downloads the program onto the hard disk 30 connected to the CPU 40 on which the program is to be run.

Next, referring to FIGS. 3 to 7, the processing of the wiring system according to this embodiment, including the processing of the wiring condition processing method, will be described. Note that the like symbols used in FIGS. 3 to 7 show the connection of processing flow; for example, (A–S) in FIG. 3 connects to (A–S) in FIG. 4 and (A–E) in FIG. 4 returns to (A–E) in FIG. 3. In this way, a sequence of processing is performed in FIGS. 3 to 4.

Figure 3:
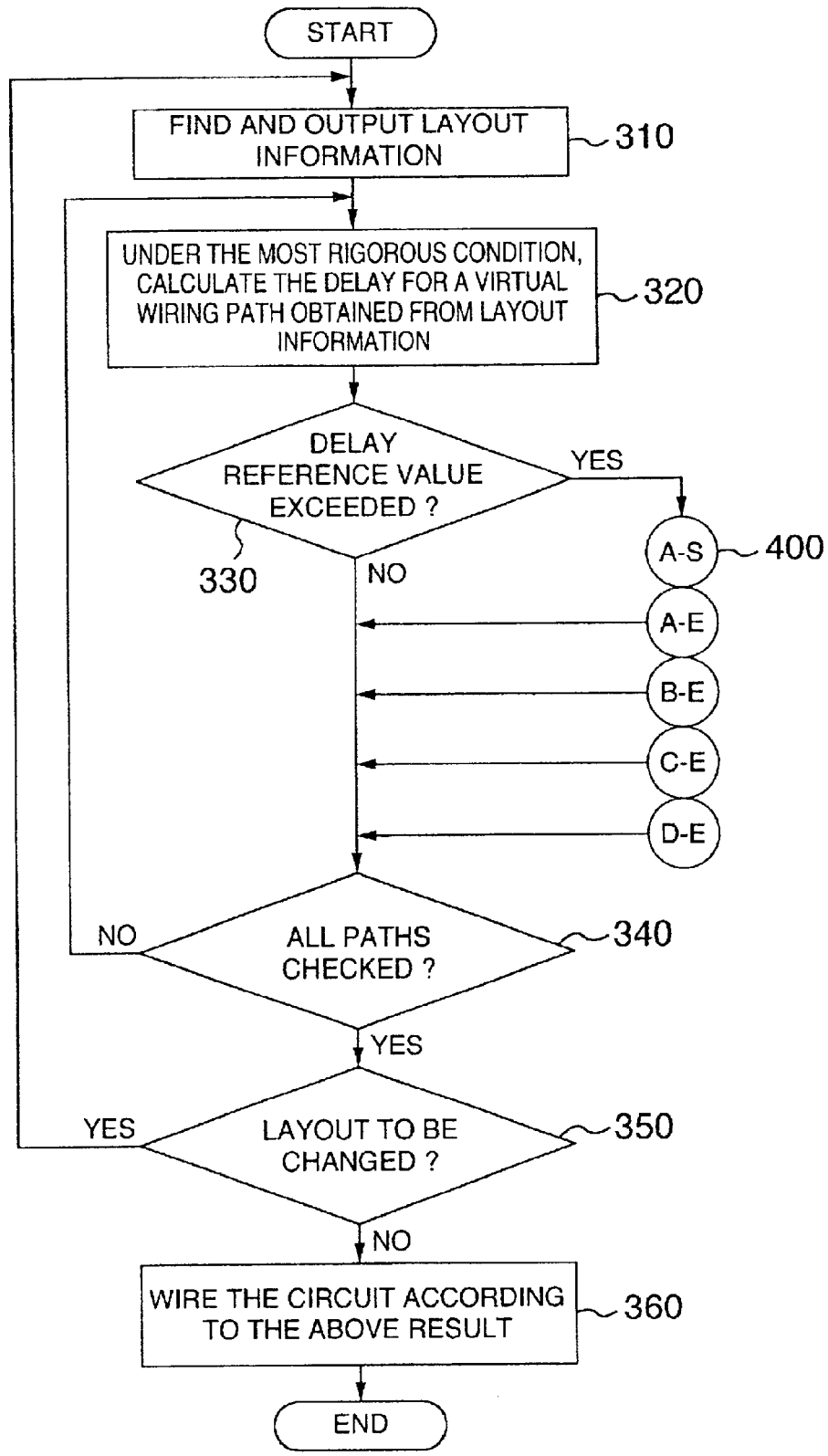
FIG. 3 is a flowchart showing the processing of the wiring system including the wiring condition processing method according to one embodiment of the present invention.

In step 310 in FIG. 3, the layout processing unit 110 finds the layout of the devices on the circuit substrate based on the logic information 210 that is information on the connection of the devices on the semiconductor integrated circuit, and outputs the layout information 220.

Figure 8:
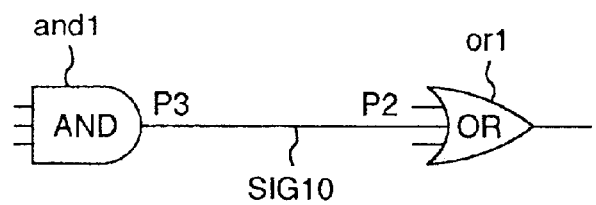
FIG. 8 is a diagram showing an example of a device-to-device connection which is a logic information source used in the wiring condition processing method according to one embodiment of the present invention.

Now, referring to FIGS. 8 and 9, an example of the logic information 210 used for the wiring condition processing method in this embodiment will be described.

For example, assume that terminal P3 of logical product device and1 and terminal P2 of logical sum device or1 are connected and that the signal line between them is called SIG10. This connection between the devices is described as the logic information 210 in FIG. 9.

Figure 9:
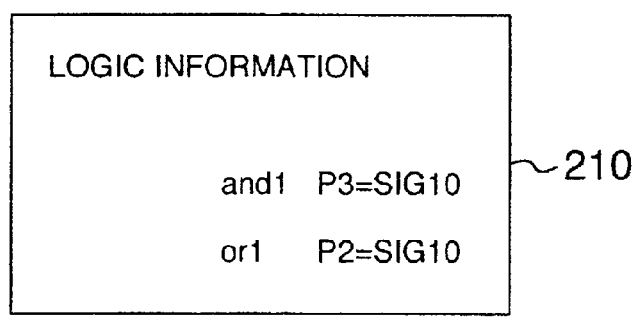
FIG. 9 is a diagram showing an example of logic information used in the wiring condition processing method according to one embodiment of the present invention.

That is, as shown in FIG. 9, "and1 P3=SIG10" in the first row of the logic information 210 indicates that the signal line name of terminal P3 of logical product device and1 is SIG10. Similarly, "or1 P2=SIG10" in the second row indicates that the signal line name of terminal P2 of logical sum device or1 is SIG10. The connection between the devices shown in FIG. 8 may be defined as described above. It should be noted that the description of the logic information 210 is not limited to the one shown in FIG. 9; other descriptions may also be used.

The layout processing unit 110 determines the optimum layout of a plurality of devices based on the connection information described in logic information 210. Many layout processing methods are known as the layout processing method of the layout processing unit 110. Any of them may be used.

Next, referring to FIGS. 10 and 11, an example of the layout information 220 obtained by the layout processing unit 110 will be described.

Figure 10:
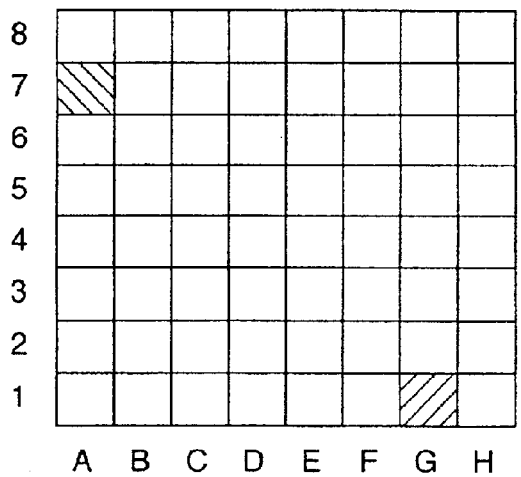
FIG. 10 is a diagram showing an example of device layout relation which is a layout information source used in the wiring condition processing method according to one embodiment of the present invention.

For example, assume that the circuit substrate is divided into eight horizontal blocks (A, ... , H) and eight vertical blocks (1, ... , 8) as shown in FIG. 10. Also assume that, as a result of layout processing performed by the layout processing unit 110, logical product device and1 is placed in block A7 and logical sum device or1 is placed in block G1. FIG. 11 shows the resulting layout information 220.

Figure 11:
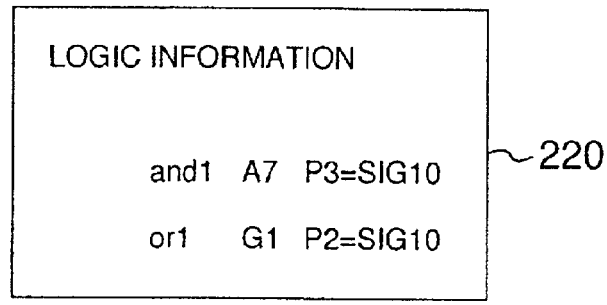
FIG. 11 is a diagram showing an example of layout information used in the wiring condition processing method according to one embodiment of the present invention.

That is, as shown in FIG. 11, "and1 A7 P3=SIG10" in the first row of the layout information 220 indicates that, in addition to the logic information 210 shown in FIG. 9, logical product device and1 is placed in block A7. Similarly, "or1 G1 P2=SIG10" in the second row indicates that, in addition to the logic information 210 shown in FIG. 9, logical sum device or1 is placed in block G1. The device layout relation shown in FIG. 10 may be defined by describing the relation as shown above. It should be noted that the description of the layout information 220 is not limited to the one shown in FIG. 11; other descriptions may also be used.

Next, in step 320 in FIG. 3, the wiring condition processing unit 120 calculates a virtual wiring path from layout information 200 and, based on this virtual wiring path, calculates the wiring delay under most rigorous condition.

The virtual wiring path may be calculated, for example, by the Steiner Tree method. Other methods may also be used. Unlike the calculation of an actual wiring path, a virtual wiring path is calculated using the device-to-device connection information (layout information) and device layout information without considering other wiring conditions.

The most rigorous delay conditions include a case in which parallel wiring lines run in both sides of the wiring path, a case in which as many wiring lines as possible cross the wiring layer, and a case in which a wiring line with the largest load capacity is used.

Now, referring to FIG. 12, an example of a virtual wiring path obtained by the wiring condition processing unit 12 will be described.

Figure 12:
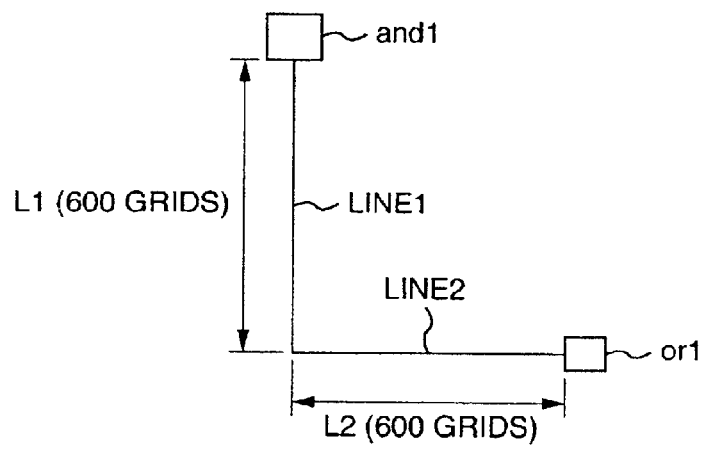
FIG. 12 is a diagram showing an example of a virtual wiring line obtained by the wiring condition processing method according to one embodiment of the present invention.

FIG. 12 shows a virtual wiring line which connects logical product circuit and1 to logical sum circuit or1 via wiring line Line1 that is L1 in length and wiring line Line2 that is L2 in length based on the layout information 220 shown in FIG. 11. For convenience of description, the most rigorous condition for this example is assumed that narrow regular wiring lines are used for wiring lines Line1 and Line2 and that they are wired in the same wiring layer to maximize the wiring load capacity.

Assume that length L1 of wiring line Line1 is, for example, 600 grids and that length L2 of wiring line Line2 is, for example, 600 grids. Then, the wiring line length is 1200 grids. When the coefficient used to find the delay of a narrow regular wire is 1.0, the delay value of the wiring line shown in FIG. 12 is calculated as 1200D (delay).

Next, in step 330 in FIG. 3, the wiring condition processing unit 120 checks if the delay value obtained in step 320 exceeds the delay reference value. If the delay value exceeds the reference delay value, control goes to step 400 in FIG. 4 via the symbol A–S. If the delay value does not exceed the reference value, control goes to step 340.

With the delay reference value assumed to be 1000D, the following describes processing that is performed after step 400 with reference to FIGS. 4 to 7.

In steps 410 to 440, the delay value is calculated assuming that the wiring line type is changed from a narrow regular wiring line to a wide wiring line that is three times wider than the regular wiring line.

Figure 4:
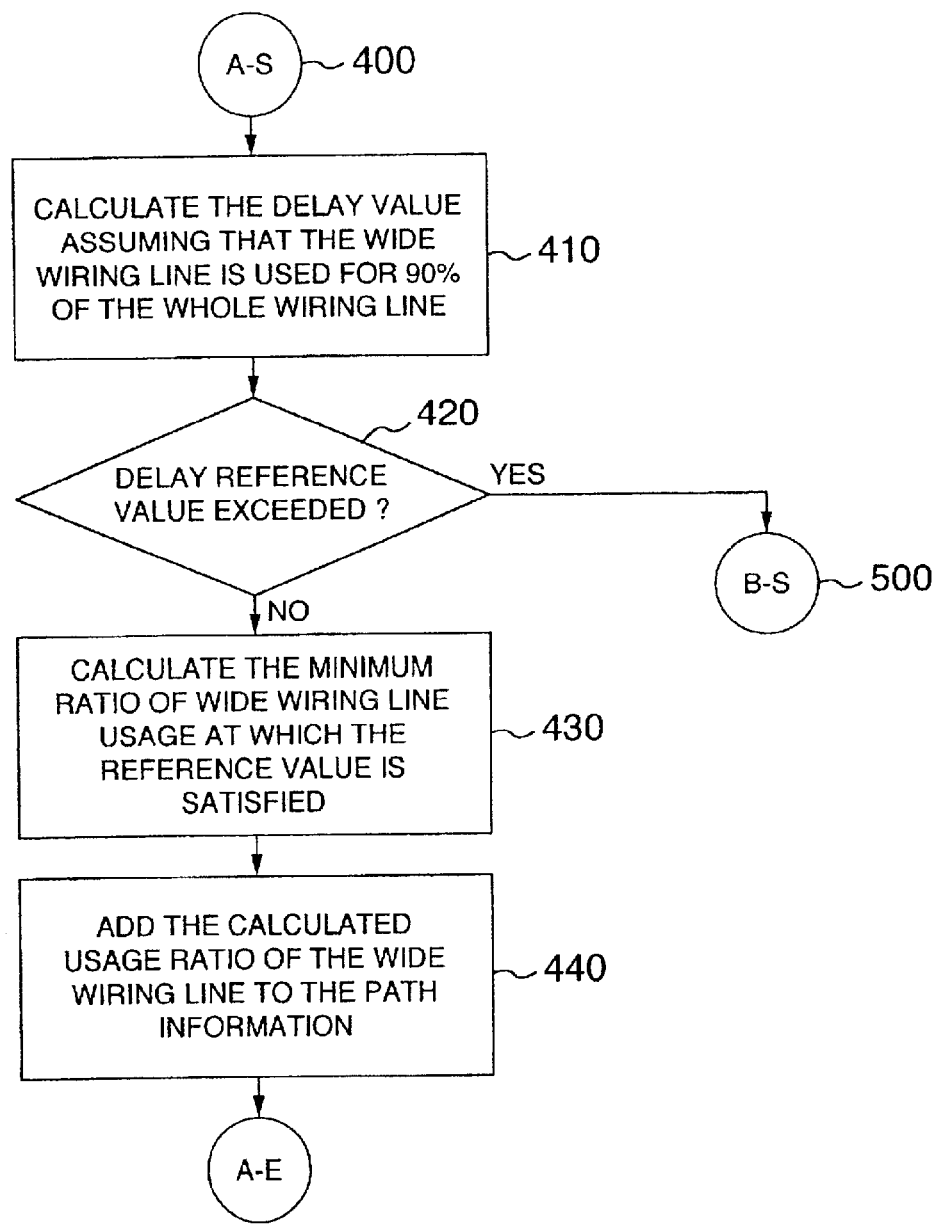
FIG. 4 is a flowchart showing the processing of the wiring system including the wiring condition processing method according to one embodiment of the present invention.

Next, in step 410 in FIG. 4, the wiring condition processing unit 120 calculates the delay value assuming, for example, that the wide wiring line is used for 90% of the whole wiring line. Because it is practically impossible to use the wide wiring line in the whole wiring line, the wiring condition processing unit 120 first assumes a more realistic condition in which 90% of the wiring line is the wide wiring line.

Let the coefficient used to find the delay for the narrow wiring line be 1.0 and let the coefficient used to find the delay for the wide wiring line that is three times wider than the regular wiring line be 0.5. Then, the delay value of the wiring line shown in FIG. 12 is calculated as (1200×10%×1.0)+(1200×90%×0.5), that is, 660D (delay).

Next, in step 420 in FIG. 4, the wiring condition processing unit 120 checks if the value calculated in step 410 exceeds the reference delay value. If the delay value exceeds the reference delay value, the wiring condition processing unit 120 judges that it is impossible to satisfy the delay restriction requirements through improvement made simply by using the wide wiring line. In this case, control goes to step 500 in FIG. 5 to execute the next improvement processing. Conversely, if the delay value does not exceed the reference delay value, control goes to step 430.

The following describes the processing that is performed in step 430 and the following steps assuming that the calculated delay value does not exceed the reference value.

In step 430 in FIG. 4, the wiring condition processing unit 120 calculates the minimum ratio of wide wiring line usage at which the reference value is satisfied. More specifically, in the example shown in FIG. 12, let the wiring length of the regular wiring line be x1 and let the wiring length of the wide wiring line be y1.

$x1+y1=1200$ $x1+0.5y1<1000$

By finding x1 and y1 satisfying the above simultaneous equation, x1=800 and y1=400 are obtained. Thus, the ratio of the wide wiring line is 33.3% (=400/1200).

Next, in step 440 of FIG. 4, the wiring condition processing unit 120 adds the calculated usage ratio of the wide wiring line to the path information to create wiring condition information 230.

Figure 13:
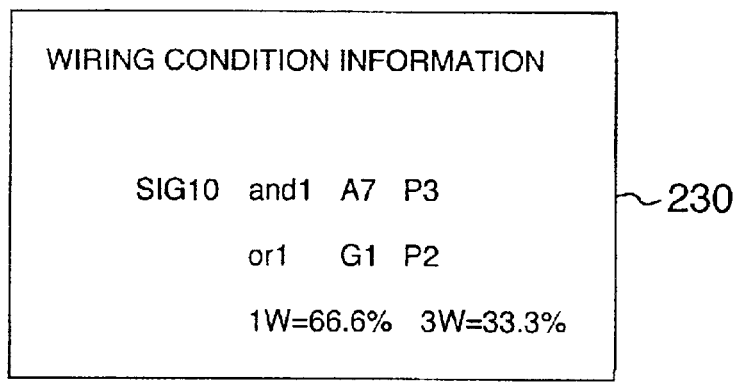
FIG. 13 is a diagram showing an example of wiring condition information obtained by the wiring condition processing method according to one embodiment of the present invention.

Referring to FIG. 13, an example of the wiring condition information 230 created by the wiring condition processing unit 120 will be described.

In FIG. 13, the first row and the second row contain path information created according to the layout information 220 shown in FIG. 11 and the third row contains added information on the usage ratio of the wide wiring line.

The path information in the first row "SIG10 and1 A7 P3" describes that the wiring line SIG10 is connected to terminal P3 of logical product device and1 placed in block A7. The path information in the second row "or1 G1 P2" describes that the wiring line SIG10 is connected to terminal P2 of logical sum device or1 placed in block G1. The added information in the third row "1W=66.6% 3W=33.3%" describes that the narrow regular wiring line is used for 66.6% of the whole wiring line and that the wide wiring line, three times as wide as the regular line, is used for 33.3% of the whole wiring line. It should be noted that the description of the wiring condition information 230 is not limited to the one shown in FIG. 13; other descriptions may also be used.

When step 440 in FIG. 4 is finished, control returns from (A–E) to the same symbol in FIG. 3 and then to step 340.

Next, the processing performed after step 500 in FIG. 5 will be described.

Figure 14A:
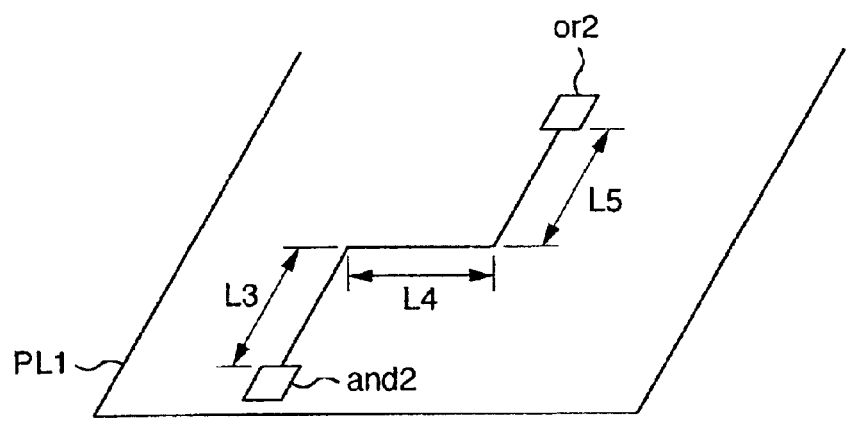
FIGS. 14A and 14B are diagrams showing other examples of virtual wiring lines obtained by the wiring condition processing method according to one embodiment of the present invention.
Figure 14B:
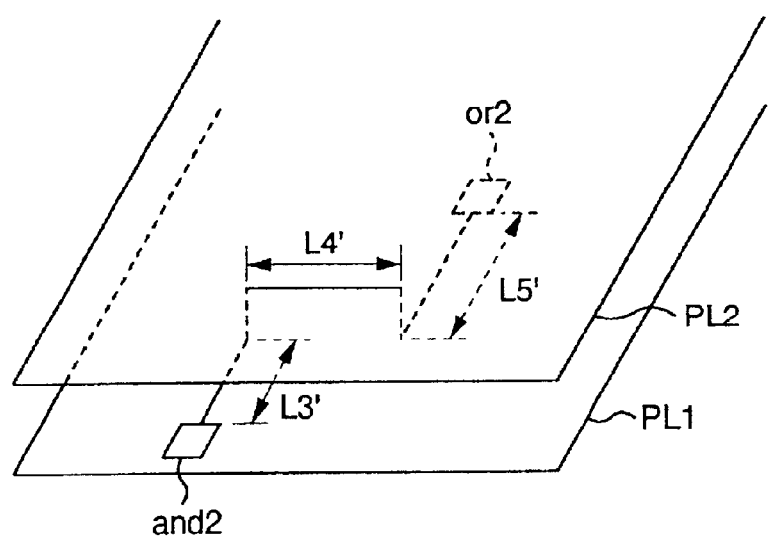

Referring to FIGS. 14A and 14B, the example used in the description of steps 510 to 540 will be described.

FIG. 14A shows that logical product circuit and2 and the logical sum circuit or2 are connected by wiring line Line 3 that is L3 in length, wiring line Line4 that is L4 in length, and wiring line Line5 that is L5 in length. For convenience of description, the most rigorous condition for this example is assumed that a narrow regular wiring line is used for wiring line Line3 and that the wiring lines are wired in the same wiring layer to maximize the wiring load capacity.

Therefore, in the example shown in FIGS. 14A and 14B, when the wiring line lengths L3, L4, and L5 are each 400 grids, the delay value is 1200D which exceeds the delay reference value (1000D).

Figure 5:
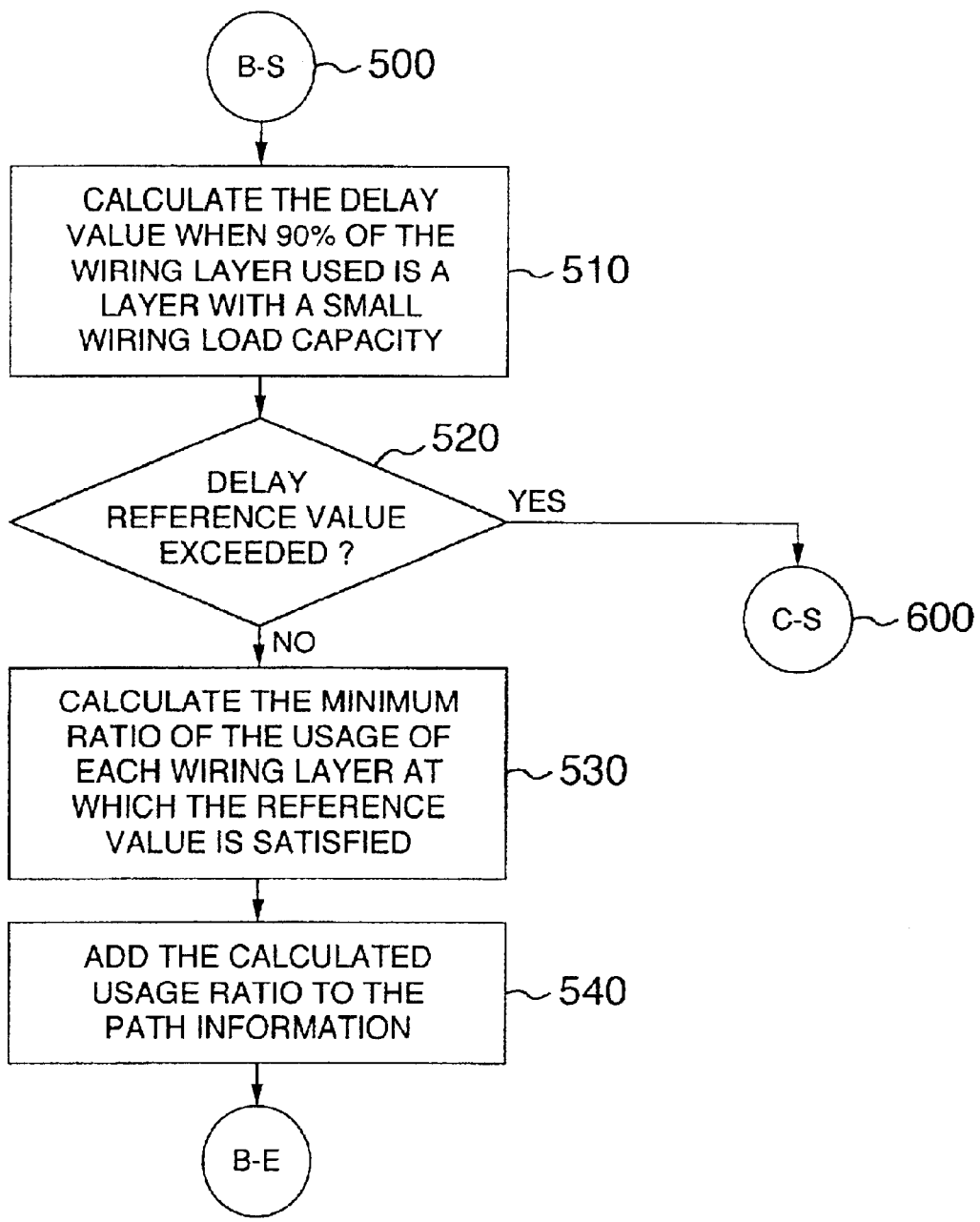
FIG. 5 is a flowchart showing the processing of the wiring system including the wiring condition processing method according to one embodiment of the present invention.

In step 510 in FIG. 5, the wiring condition processing unit 120 calculates the delay that will be created when 90% of the wiring line is in the wiring layers with a small wiring load.

That is, as shown in FIG. 14B, the wiring layer is usually a multi-layer wiring layer composed, for example, of the first wiring layer PL1, second wiring layer PL2, and so on. And, the coefficient used to calculate the delay of a regular wiring line varies from layer to layer; for example, when the delay of the first wiring layer PL1 is 1.0, the delay of the first wiring layer PL2 is 0.8. In the following description, a two-layer wiring layer is assumed. The delay value may be calculated similarly for a multi-layer wiring layer composed of three or more layers.

Assuming that 90% (1080 grids) of the total wiring line length (1200 grids) is in the second wiring layer and that the remaining 120 grids are in the first wiring layer, the wiring condition processing unit 120 calculates the delay value. The resulting delay value is therefore 984D (=1200+1080×0.8).

As in step 410, because it is practically impossible to use a layer with a small load capacity for the whole wiring line, the wiring condition processing unit 120 first assumes that, for example, 90% of the wiring line is in the layer with a small load capacity.

Next, in step 520 in FIG. 5, the wiring condition processing unit 120 checks if the calculated delay value exceeds the reference delay value (1000D). If the delay value exceeds the reference delay value, the wiring condition processing unit 120 judges that it is impossible to satisfy the delay restriction requirements through improvement made by changing the wiring layer. In this case, control goes to step 600 in FIG. 6 to execute the next improvement processing. Conversely, if the delay value does not exceed the reference delay value, control goes to step 530.

The following describes the processing that is performed in step 530 and the following steps assuming that the calculated delay value does not exceed the reference value.

In step 530 in FIG. 5, the wiring condition processing unit 120 calculates the minimum ratio of the usage of each wiring layer at which the reference value requirements are satisfied. More specifically, in the example shown in FIG. 14, let the length of the wiring line in the first wiring layer be x2 and let the length of the wide wiring line be y2.

$$x2+y2=1200$$

$$x2+0.8y2<1000$$

By finding x2 and y2 satisfying the above simultaneous equation, x2=200 and y2=100 are obtained. Thus, the ratio of the wide wiring line is 84% (=1000/1200).

Next, in step 540 in FIG. 5, the wiring condition processing unit 120 adds the calculated usage ratio of the second wiring layer to the path information as the second wiring layer usage ratio to create wiring condition information 230. For example, "PL1=16% PL2=84%" is added in the fourth row as the added information. It should be noted that the description of the wiring condition information 230 is not limited to the one shown in FIG. 13; other descriptions may also be used.

When step 540 in FIG. 5 is finished, control returns from (B–E) to the same symbol in FIG. 3 and then to step 340.

Next, the processing performed after step 600 in FIG. 6 will be described.

Figure 15:
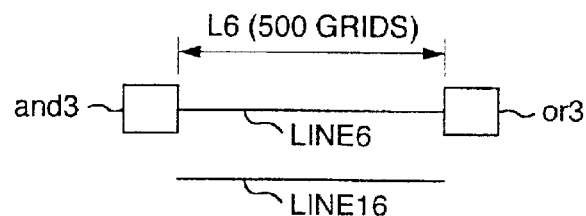
FIG. 15 is a diagram showing another example of a virtual wiring line obtained by the wiring condition processing method according to one embodiment of the present invention.

Referring to FIG. 15, an example of a wiring line used in the description of steps 610 to 640 will be described.

In step 320 in FIG. 3, one of the conditions under which the delay is most rigorous is a case in which there are parallel wiring lines that run along the wiring path. The following describes this example. Although a parallel line is only in one side of the wiring path in the following description, the following description applies also to a case in which there are parallel wiring lines in both sides of the wiring path.

FIG. 15 shows a virtual wiring line which connects logical product circuit and3 to logical sum circuit or3 via wiring line Line6 that is L6 in length. For convenience of description, the most rigorous condition for this example is assumed that a narrow regular wiring line is used for wiring line Line6 and that it is wired in the same wiring layer to maximize the wiring load capacity.

In addition, it is assumed that wiring line Line16 runs parallel to wiring line Line6. The parallel wiring line, which involves the capacity between the parallel wiring lines, increases the load capacity. The percentage of the increased load capacity depends on the wiring process; that is, it varies according to the distance between the parallel lines. In the following description, the delay value is assumed to increase by 20D for each wiring line length of 10.

Thus, in the example shown in FIGS. 14A and 14B, when the length L3 of wiring line Line 3 is 500 grids, the delay value is 500D. In addition, because the delay value of 1000D (=500×2) caused by the parallel wiring line Line 13 is added, the total delay value is 1500D which exceeds the delay reference value (1000D).

Figure 6:
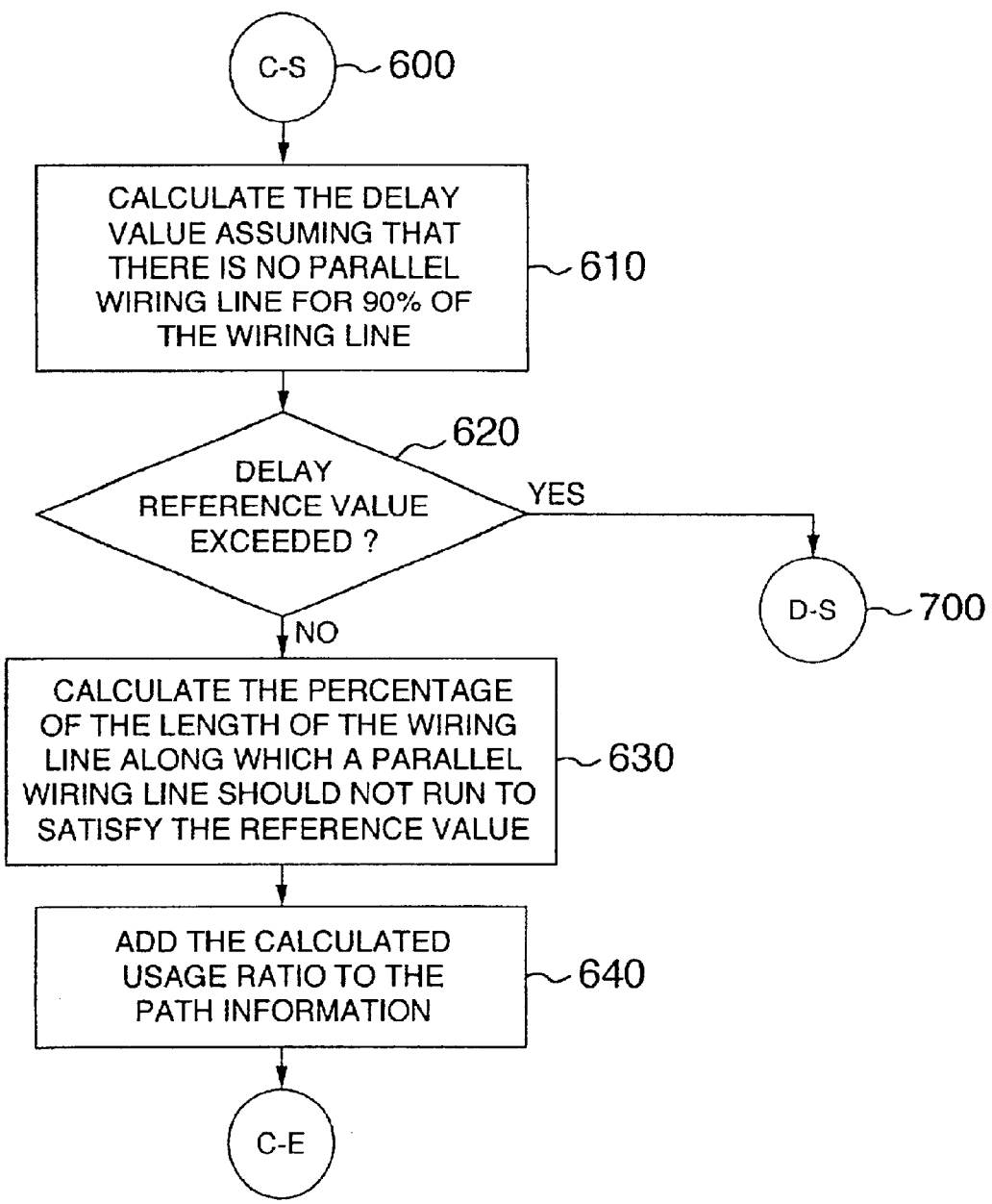
FIG. 6 is a flowchart showing the processing of the wiring system including the wiring condition processing method according to one embodiment of the present invention.

In step 610 in FIG. 6, the wiring condition processing unit 120 calculates the delay value assuming that there is no parallel wiring line for 90% of the wiring line.

That is, for the wiring line Line16 that is 500 grids as shown in FIG. 15, when there is no parallel wiring line for 90% and there is a parallel wiring line for 10% (wiring line length: 50 grids), the delay caused by the parallel wiring line is 100D. Because the delay caused by the wiring line Line6 is 500D, the total delay value becomes 600D.

Because it is not realistic, as in steps 410 and 510, to assume a case in which there is no parallel wiring line for the whole wiring path, the wiring condition processing unit 120 assumes a more realistic condition in which there is no parallel wiring line, for example, for 90% of the wiring path.

Next, in step 620 in FIG. 6, the wiring condition processing unit 120 checks if the calculated delay value exceeds the delay reference value (1000D). If the delay value exceeds the reference delay value, the wiring condition processing unit 120 judges that it is impossible to satisfy the delay restriction requirements through improvement made by changing the use of the parallel wiring line. In this case, control goes to step 700 in FIG. 7 to execute the next improvement processing. Conversely, if the delay value does not exceed the reference delay value, control goes to step 630.

The following describes the processing that is performed in step 630 and the following steps assuming that the calculated delay value does not exceed the reference value.

In step 630 in FIG. 5, the wiring condition processing unit 120 calculates the percentage of the length of the wiring line along which a parallel wiring line should not run to satisfy the reference value. More specifically, in the example shown in FIG. 15, let the wiring length of the wiring line Line6 be x3 and let the wiring length of the parallel wiring line be y3.

$$x3+2 \cdot y3<1000$$

From the above expression, y3=250 because x3=500. Therefore, the ratio of the wiring line along which a parallel wiring line should not run is 50% (=(500−250)/500).

Next, in step 640 in FIG. 6, the wiring condition processing unit 120 adds the calculated parallel wiring line usage limitation percentage to the path information on the wiring line as the parallel wiring line usage ratio to create wiring condition information 230. For example, "PARALLEL= 50%" is added to the example shown in FIG. 13 as the parallel wiring line usage ratio. It should be noted that the description of the wiring condition information 230 is not limited to the one shown in FIG. 13; other descriptions may also be used.

When step 640 in FIG. 6 is finished, control returns from (C–E) to the same symbol in FIG. 3 and then to step 340.

Next, the processing performed after step 700 in FIG. 7 will be described.

In FIGS. 4 to 6, the use of a wide wiring line, a wiring layer with a small load capacity, or a parallel wiring line is restricted independently. On the other hand, when the wiring condition processing unit 120 has found, in step 620 in FIG. 6, that the delay reference value is exceeded, it performs simulation in steps after step 700 to check if the restriction requirements are satisfied by combining the above three.

Figure 7:
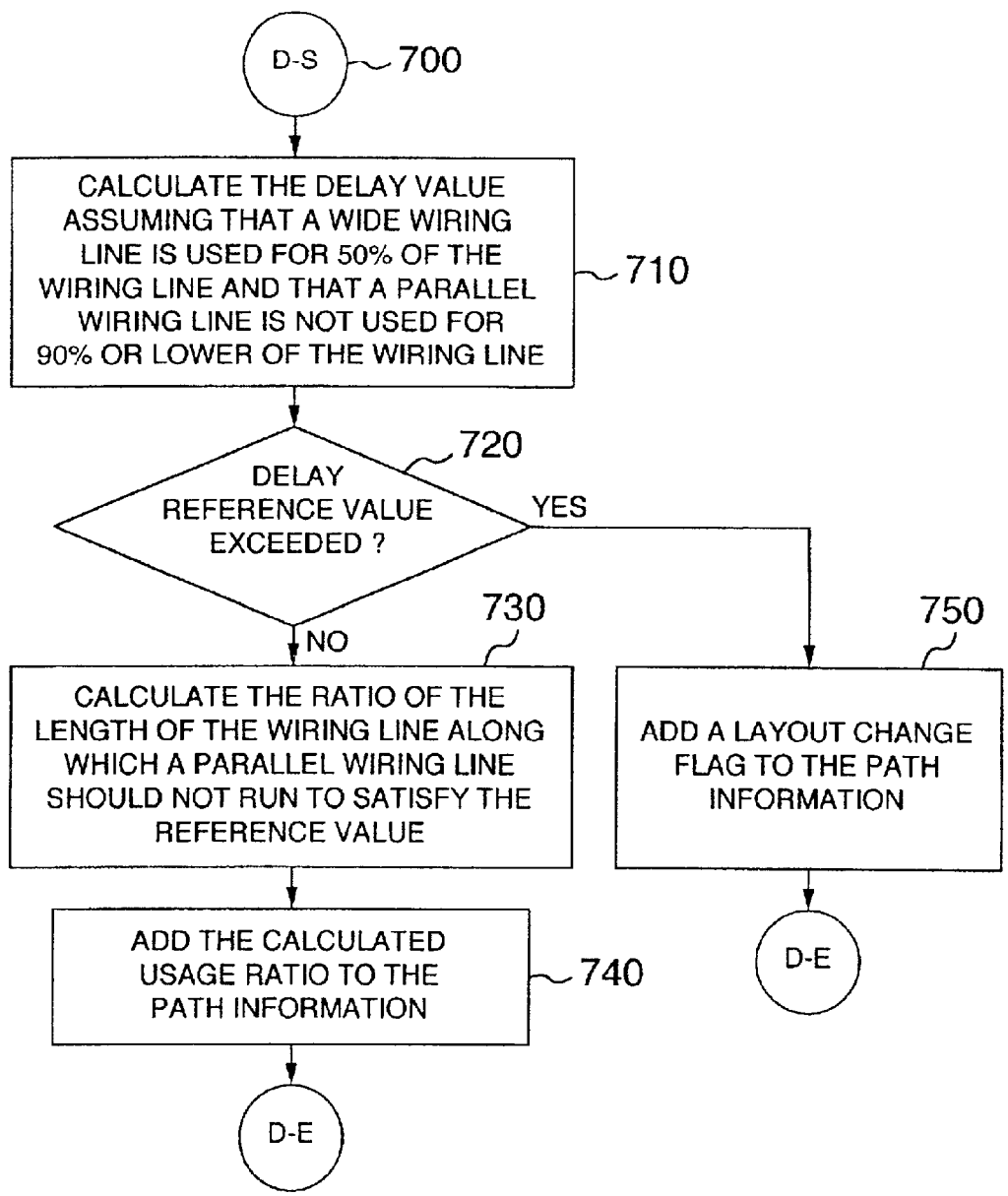
FIG. 7 is a flowchart showing the processing of the wiring system including the wiring condition processing method according to one embodiment of the present invention.

That is, in step 710 in FIG. 7, the wiring condition processing unit 120 calculates the delay value assuming that a wide wiring line is used for 50% of the wiring line and that a parallel wiring line is not used for 90% of the wiring line. Any combination of restrictions may be selected. For example, a wide wiring line may be used for 50% of the wiring line and a small-load capacity wiring layer may be used for 90% of the whole wiring line.

Next, in step 720, the wiring condition processing unit 120 checks if the calculated delay value exceeds the delay reference value. If the delay value exceeds the reference delay value, control goes to step 750. If the delay value does not exceed the reference value, control goes to step 730.

If the calculated delay value exceeds the delay reference value, the wiring condition processing unit 120 judges that it is impossible to satisfy the delay restriction requirements through improvement made by the combination of the parallel wiring line and the wide wiring line. In this case, the wiring condition processing unit 120 adds a layout change indication flag in step 750, indicating that the layout of the wiring line should be changed, and then passes control to step 340.

If the delay value does not exceed the delay reference value, the wiring condition processing unit 120 calculates, in step 730, the ratio of the length of the wiring line along which a parallel wiring line should not run to satisfy the reference value. This calculation may be made by any combination of above-described methods.

Next, in step 740, the wiring condition processing unit 120 adds the calculated parallel wiring line usage percent to the path information on the wiring line as the parallel wiring line usage ratio and, at the same time, adds 50% as the wide wiring line usage ratio.

When step 740 or step 750 in FIG. 7 is finished, control returns from (D–E) to the same symbol in FIG. 3 and then to step 340.

When control returns to step 340 in FIG. 3, the wiring condition processing unit 120 checks if the processing after step 320 has been performed for all paths (wiring lines). If the processing is not yet performed for all paths, control goes to step 320 to repeat the processing. If the processing is already performed for all paths, control goes to step 350.

In step 350, the wiring condition processing unit 120 checks if there is a path requiring a layout change. This is done by checking if the layout change indication flag that was added in step 750. If there is the flag, the wiring condition processing unit 120 returns control to step 310, performs layout improvement processing for the gates including the path, and repeats steps 320 to 350 for the wiring lines included in the changed gates so that all paths satisfy the delay requirements. After layout change and delay verification, control goes to step 360.

Although only one combination was described in detail in the above description, it is also possible to find a combination which satisfies the restriction by adjusting the use of a wide wiring line assuming that a parallel wiring line is provided for 50% of the wiring line or by varying other factors. What combination to use depends on what effect a specific factor will have on the restriction value and on which semiconductor process technology will be used. Therefore, the combination may be selected appropriately according to the process technology. This combination varies from semiconductor to semiconductor. To allow the combination to be selected more flexibly, the program provides parameters for externally specifying a priority or ratios.

In step 360 in FIG. 3, the wiring processing unit 130 performs wiring processing based on the restriction information added to the path information and then outputs the obtained wiring result to the wiring information 240. During wiring processing, the wiring processing unit 130 controls wiring according to the factors calculated through delay simulation (wide wiring line usage ratio, wiring layer usage ratio, parallel wiring line usage restriction, and so on).

Figure 16:
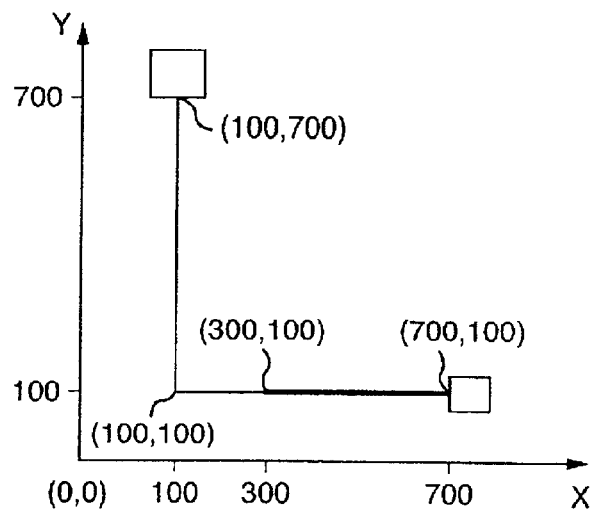
FIG. 16 is a diagram showing an example of a wiring line obtained through wiring processing according to one embodiment of the present invention.
Figure 17:
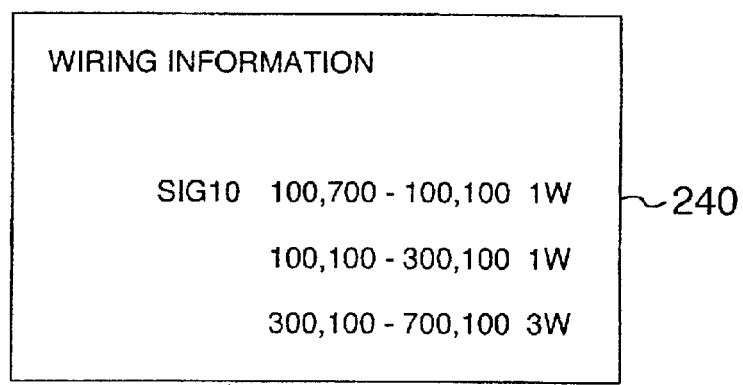
FIG. 17 is a diagram showing an example of wiring information obtained through wiring processing according to one embodiment of the present invention.

Now, referring to FIGS. 16 and 17, the following describes an example of wiring processing results.

For example, when the restriction on the wide wiring line usage ratio of "1W=66.6% 3W=33.3%" is added as the wiring condition information on the wiring line shown in FIG. 12, the wiring processing unit 130 performs wiring so that the ratio of a wide wiring line is 33.3% or lower. The result is, for example, the wiring line shown in FIG. 16. The wiring line is represented by the (X,Y) coordinates. In the example shown in the figure, a regular narrow wiring line is used for 600 grids from the coordinates (100, 700) to the coordinates (100, 100) and for 200 grids from the coordinates (100, 100) to the coordinates (300, 100), and a wide wiring line is used for 400 grids from the coordinates (300, 100) to the coordinates (700, 100). This wiring results in the ratio of 33.3% or lower for the wide wiring. The position where the wide wiring line is used varies depending upon the relation with other wiring lines. For example, the wide wiring line may be used for 400 grids from the coordinates (100, 700) to the coordinates (100, 300) or for the middle of the wiring line.

The wiring information 240 will be described with reference to FIG. 17.

As shown in FIG. 17, "SIG10 100,700-100,100 1W" in the first row of the wiring information 240 indicates that a regular wiring line is used for the coordinates (100, 700) to the coordinates (100, 100). "100,100-300,100 1W" in the second row indicates that a regular wiring line is used for the coordinates (100, 100) to the coordinates (300, 100) of the wiring line SIG10. "300,100-700,100 3W" in the third row indicates that a wide wiring line is used for the coordinates (300, 100) to the coordinates (700, 100) of the wiring line SIG10.

By performing wiring processing after finding the wiring condition using a virtual wiring as shown above, it is possible to minimize, after actual wiring, the number of wiring lines which do not satisfy the delay restriction.

The minimized use of wide wiring lines increases wiring efficiency and reduces the chip size.

In addition, the minimized restriction on parallel wiring lines allows more channels to be used, prevents wiring failures, and reduces the chip size.

As described above, when creating a semiconductor integrated circuit that executes a specific logic while satisfying the delay restriction, it is possible to create, in this embodiment, a circuit which consumes power less than a circuit created in the conventional method.

Simulation of the use of a wide wiring line using the layout result makes it possible to use the wide wiring line only when it is efficient and prevents its wasteful use. This increases the number of normal wiring channels, prevents wiring failures, and reduces parallel wiring lines.

Reducing parallel wiring lines also reduces a variation in delay and increases the speed.

Simulation using the layout result avoids wiring failures and therefore the need for re-wiring.

By calculating the usage ratio of each of a plurality of wiring layers, each with its own wiring load capacity, for satisfying the allowable delay requirements and by actually performing wiring according to the ratio, it is possible to find a solution satisfying the delay restriction requirements without having to use a wide wiring line. This reduces the amount of wide wiring lines.

Simulation of a delay of a wiring line with no parallel wiring line gives a solution satisfying the restriction requirements and reduces the amount of wide wiring lines.

In addition, setting up the parallel wiring prohibition condition for each wiring line increases the number of wiring channels, makes it easy to use regular wiring lines, prevents wiring failures, and reduces the wiring time.

In the above embodiment, the delay value variation factors include wiring line widths, wiring load capacity in each wiring layer, and parallel wiring lines. In addition to those factors, the wiring line material affects the delay value. For example, when comparing with aluminum wiring lines, copper wiring lines have smaller delays. That is, to resolve a delay violation in a specific wiring line, it is possible to satisfy the delay restriction requirements by calculating, for example, the ratio of a copper wiring line, by adding the ratio information to the path information, and by performing wiring according to the ratio. However, it is difficult to use different materials in the same wiring layer. Therefore, it is suggested that the wiring material be selected for each layer and that the usage ratio of each wiring layer be added to the path information.

The present invention is not limited to the embodiments described above but may be embodied in other specific forms without departing from the sprit or essential characteristics thereof.

The modes of the present invention are as follows:

1) A wiring condition processing method for a semiconductor integrated circuit wherein, when the delay value of a virtual wiring line length based on information on the layout of semiconductor devices on the substrate exceeds a reference value, the method combines at least two of three types of information, that is, information on the usage ratio of a wide wiring line, information on the usage ratio of a wiring layer with a small wiring load capacity, and information on the usage ratio of a parallel wiring line and adds said at least two types of information to path information to create wiring condition information.

2) A wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a wide wiring line to path information to create wiring condition information.

3) A wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a wiring layer with a small wiring load capacity to path information to create wiring condition information.

4) A wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a parallel wiring line to path information to create wiring condition information.

5) A recording medium storing thereon a wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a wide wiring line to path information to create wiring condition information.

6) A recording medium storing thereon a wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a wiring layer with a small wiring load capacity to path information to create wiring condition information.

7) A recording medium storing thereon a wiring condition processing system for a semiconductor integrated circuit wherein, when the delay value of a virtual wiring line length based on information on the layout of semiconductor devices on the substrate exceeds a reference value, the system comprises a wiring processing unit which adds information on the usage ratio of a parallel wiring line to path information to create wiring condition information.

What is claimed is:

1. A computer program stored on a storage medium for performing wiring condition processing for a semiconductor integrated circuit, said computer program when executed causes a computer to perform the steps of:

creating layout information to determine a layout of devices on the semiconductor integrated circuit based on logic information describing connections of the devices on the semiconductor integrated circuit;

determining a virtual wiring path from the layout information;

calculating a wiring delay value based on the virtual wiring path;

upon the calculated wiring delay value of the virtual wiring path exceeding a predetermined reference value, calculating a wiring delay value of the virtual wiring path when a wide wiring line is used at a predetermined usage ratio;

upon the wiring delay value of the virtual wiring path when the wide wiring line is used at the predetermined usage ratio not exceeding the predetermined reference value, calculating a minimum usage ratio of the wide wiring line such that the wiring delay value satisfies the predetermined reference value; and adding information on the calculated minimum usage ratio of the wide wiring line to information on the virtual wiring path to create wiring condition information.

2. A computer program stored on a storage medium for performing wiring condition processing for a semiconductor integrated circuit, said computer program when executed causes a computer to perform the steps of:

creating layout information to determine a layout of devices on the semiconductor integrated circuit based on logic information describing connections of the devices on the semiconductor integrated circuit;

determining a virtual wiring path from the layout information;

calculating a wiring delay value based on the virtual wiring path;

upon the calculated wiring delay value of the virtual wiring path exceeding a predetermined reference value, calculating a wiring delay value of the virtual wiring path when a wiring layer with a small wiring load capacity is used at a predetermined usage ratio;

upon the wiring delay value of the virtual wiring path when the wiring layer with a small wiring load capacity is used at the predetermined usage ratio not exceeding the predetermined reference value, calculating a minimum usage ratio of the wide wiring line such that the wiring delay value satisfies the predetermined reference value; and adding information on the calculated minimum usage ratio of the wiring layer with a small wiring load capacity to information on the virtual wiring path to create wiring condition information.

3. A computer program stored on a storage medium for performing wiring condition processing for a semiconductor integrated circuit, said computer program when executed causes a computer to perform the steps of:

creating layout information to determine a layout of devices on the semiconductor integrated circuit based on logic information describing connections of the devices on the semiconductor integrated circuit;

determining a virtual wiring path from the layout information;

calculating a wiring delay value based on the virtual wiring path;

upon the calculated wiring delay value of the virtual wiring path exceeding a predetermined reference value, calculating a wiring delay value of the virtual wiring path when parallel wiring lines are used at a predetermined usage ratio;

upon the wiring delay value of the virtual wiring path when the parallel wiring lines are used at the predetermined usage ratio not exceeding the predetermined reference value, calculating a minimum usage ratio of the wide wiring line such that the wiring delay value satisfies the predetermined reference value; and adding information on the calculated minimum usage ratio of the wiring layer with parallel wiring lines to information on the virtual wiring path to create wiring condition information.

4. A computer program stored on a storage medium for performing wiring condition processing for a semiconductor integrated circuit, said computer program when executed causes a computer to perform the steps of:

creating layout information to determine a layout of devices on the semiconductor integrated circuit based on logic information describing connections of the devices on the semiconductor integrated circuit;

determining a virtual wiring path from the layout information;

calculating a wiring delay value based on the virtual wiring path;

upon the calculated wiring delay value of the virtual wiring path exceeding a predetermined reference value, calculating a wiring delay value of the virtual wiring path when a wide wiring line is used at a predetermined usage ratio of the wiring line and parallel wiring lines are used at a usage ratio which is less than another predetermined usage ratio;

upon the wiring delay value of the virtual wiring path when the wide wiring line is used at the predetermined usage ratio of the wiring line and the parallel wiring lines are used at a usage ratio which is less than another predetermined usage ratio not exceeding the predetermined reference value, calculating a ratio of a length of the wiring line along which parallel wiring lines should not run to satisfy the reference value; and adding information on the calculated usage ratio of the wiring layer to information on the virtual wiring path to create wiring condition information.

* * * * *